United States Patent [19]

Tustaniwskyj et al.

[11] Patent Number: 4,721,996
[45] Date of Patent: Jan. 26, 1988

[54] SPRING LOADED MODULE FOR COOLING INTEGRATED CIRCUIT PACKAGES DIRECTLY WITH A LIQUID

[75] Inventors: Jerry I. Tustaniwskyj, Mission Viejo; Kyle G. Halkola, San Diego, both of Calif.

[73] Assignee: Unisys Corporation, Detroit, Mich.

[21] Appl. No.: 918,054

[22] Filed: Oct. 14, 1986

[51] Int. Cl.$^4$ .................. H01L 25/04; H02B 1/00
[52] U.S. Cl. .................................. 357/82; 361/385
[58] Field of Search ...................... 357/82; 361/385

[56] References Cited

U.S. PATENT DOCUMENTS

| | | | |
|---|---|---|---|
| 2,952,786 | 9/1960 | Lewis | 361/386 |
| 3,649,738 | 3/1972 | Andersson et al. | 357/82 |
| 4,381,032 | 4/1983 | Cutchaw | 361/385 |
| 4,479,140 | 10/1984 | Horvath | 357/82 |

OTHER PUBLICATIONS

"Device Cooling", A. H. Johnson, IBM Technical Disclosure Bulletin, vol. 20, No. 10, Mar. 1978.
"Cooling System for Semiconductor Chips", J. Landrock et al., IBM Technical Disclosure Bulletin, vol. 23, No. 4, Sep. 1980.

Primary Examiner—Robert S. Macon
Attorney, Agent, or Firm—Charles J. Fassbender; L. Joseph Marhoefer

[57] ABSTRACT

A liquid cooled circuit module comprises an integrated circuit package; a cover having a rim which lies against the integrated circuit package, the cover being shaped to form a passage for the liquid between the integrated circuit package and the cover; a retaining mechanism, which is fastened directly to the integrated circuit package, and which includes a member that extends above the cover; and a spring, which is held in compression between the cover and the retaining mechanism member; the spring being adapted to press the rim against the integrated circuit package with at least a predetermined minimal force which prevents leaks and at the same time not exceed a stress limit in the spring. In one embodiment of the module, the retaining mechanism includes headed pins which are fixedly attached to the integrated circuit package; the retaining mechanism member has tapered openings which are aligned with the pins and in which the headed pins removably lock; and the spring is adapted to maintain at least the predetermined minimal force on the rim and simultaneously not exceed the stress limit even under the condition where the spring is compressed by a variable distance due to several manufacturing tolerances within the module.

10 Claims, 15 Drawing Figures

Fig. 4 eq.1 $P_a + \frac{1}{2}\rho V_a^2 + \rho g h_a = P_b + \frac{1}{2}\rho V_b^2 + \rho g h_b + L_{ab}$ eq.2 $V_a = 0$ eq.3 $P_b = P_a + \rho g(h_a - h_b) - \frac{1}{2}\rho V_b^2 - L_{ab}$ eq.4 if $P_b$ subatmospheric
then $\frac{1}{2}\rho V_b^2 + L_{ab} > \rho g(h_a - h_b)$ eq.5 $Q = 25 \, ml/sec$ eq.6 $Q_T = 200 \, ml/sec$ eq.7 $\Delta P$ for $\frac{1}{2}"$ dia valve $= 0.65 \, psi$ eq.8 $\rho g(h_a - h_b)$ for $6"$ of $H_2O \cong 0.2 \, psi$ eq.9 $H_e = \dfrac{k_e V^2}{2g}$ eq.10 dia. $17e = 0.15"$, dia. $17d = 0.25"$, $k_e = 0.42$ eq.11 $H_e = 4.05"$ eq.12 $H_c = \dfrac{k_c V^2}{2g}$ eq.13 dia. $17e = 0.15"$, dia. $17d = 0.25"$, $k_c = 0.32$ eq.14 $H_c = 3.07"$ eq.15 $H_e + H_c = 7.14"$

Fig. 5 eq. 1  $\frac{1}{2}\rho V^2_b + L_{ab} > \rho g(h_a - h_b)$ eq. 2  $L_{ab} = K_c V^2_c + nK_b V^2_b$ eq. 3  $V^2_b = C_b V^2_c$ eq. 4  $\frac{1}{2}\rho C_b V^2_c + K_c V^2_c + nK_b C_b V^2_c > \rho g(h_a - h_b)$ eq. 5  $P_a + \frac{1}{2}\rho V^2_a + \rho g h_a = P_e + \frac{1}{2}\rho V^2_e + \rho g h_e + L_{ae}$ eq. 6  $P_a = P_e, \; V_a = 0$ eq. 7  $\rho g h_a = \frac{1}{2}\rho V^2_e + \rho g h_e + L_{ae}$ eq. 8  $L_{ae} = K_c V^2_c + NK_b V^2_b + K_d V^2_d$ eq. 9  $V^2_e = C_e V^2_c, \; V^2_d = C_d V^2_c$ eq. 10  $\rho g(h_a - h_e) = \frac{1}{2}\rho C_e V^2_c + K_c V^2_c + NK_b C_b V^2_c + K_d C_d V^2_c$ eq. 11  $\left[\frac{1}{2}\rho C_b + K_c + nK_b C_b\right](h_a - h_e)$
$> \left[\frac{1}{2}\rho C_e + K_c + NK_b C_b + K_d C_d\right](h_a - h_b)$

Fig. 8 eq. 1  $F_{SP} = PA + F_{SR}$    eq. 2  $F_{SP} = kD$ eq. 2  $kD = PA + F_{SR}$    eq. 4  $kD_{MIN} > PA + F_{SRMIN}$ eq. 5  $k = \dfrac{CEh^3}{3} \left\{ \dfrac{1}{\dfrac{L^2}{4} + \left(\dfrac{2w_S}{C} - L\right)\left[\left(\dfrac{L}{2} - \dfrac{w_S}{C}\right) \ln\left(1 - \dfrac{CL}{2w_S}\right) - \dfrac{L}{2}\right]} \right\}$ where $C = \left(\dfrac{w_B - w_S}{L}\right)$ eq. 6  $S = 3/2 \left(\dfrac{F_{SP} L}{w_S h^2}\right)$    eq. 7  $S = 3/2 \left(\dfrac{kDL}{w_S h^2}\right)$ eq. 8  $S_{MAX} > 3/2 \left(\dfrac{kD_{MAX} L}{w_S h^2}\right)$

Fig. 9

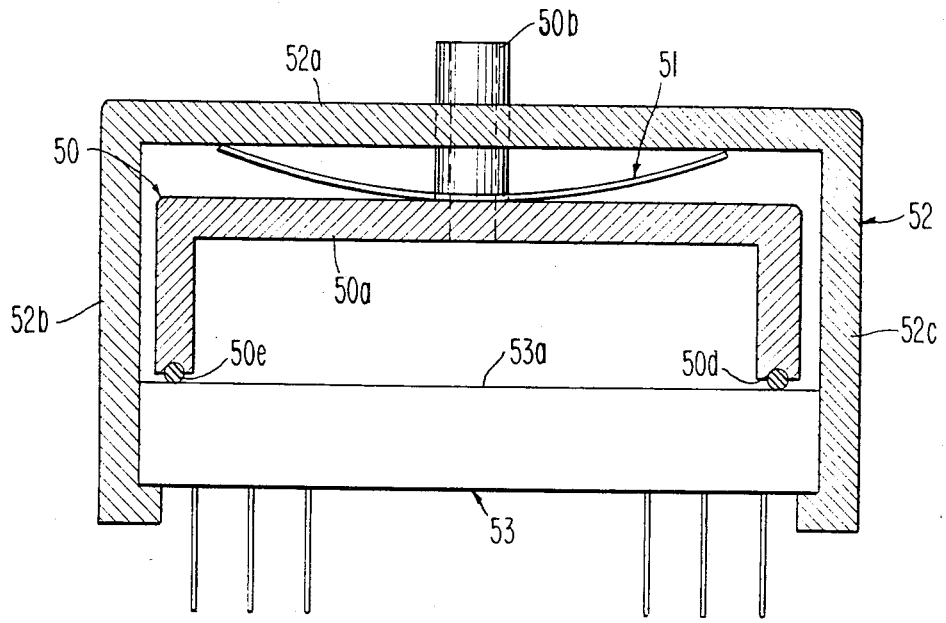

SPRING LOADED MODULE FOR COOLING INTEGRATED CIRCUIT PACKAGES DIRECTLY WITH A LIQUID

BACKGROUND OF THE INVENTION

This invention relates to systems for cooling electrical components; and more particularly, it relates to systems for cooling integrated circuit packages with a liquid in a digital computer.

Initially in the prior art, integrated circuits in digital computers were cooled by convection with air. Typically, the integrated circuits of the computer were mounted on several printed circuit boards which in turn were mounted in a frame. Then one or more fans were provided within the frame to simply blow air across the integrated circuits. Such a cooling system is relatively inexpensive; however, it also has several major limitations.

For example, as the amount of circuitry on an integrated circuit chip increases, the amount of power and the amount of heat which that chip dissipates also increases. Thus a point is eventually reached with very large scale integrated circuits or with multichip integrated circuit packages at which the power dissipation is simply too high to allow cooling by air convection. Also, the logic gates in integrated circuit packages operate at slower speeds as their operating temperature is raised. Further, integrated circuits are more prone to failure when they are operated at higher temperature.

Accordingly, in the prior art, systems for cooling integrated circuits by conduction with a liquid have been developed. One such system which IBM uses for example in their 3081 computers, consists essentially of a plurality of 3081 multichip cooling modules. Each module includes a base plate, a substrate with several integrated circuit chips, a piston holding plate, and a cold plate with water channels. These items are bolted together one on top of the other in the above recited order.

Formed in the piston holding plate are several cylinders, each of which contains a helical spring and a piston. In operation, each spring pushes a piston against a respective integrated circuit chip on the substrate; and heat from each chip then travels in a serial fashion through the piston, through the cylinder sidewalls, and into the cold plate to the water.

However, cooling in this IBM module is still substantially limited because the water does not flow directly over the surface of the integrated circuit chips, and because thermal conduction between a piston and a cylinder sidewall is poor. In addition, liquid can leak from the cold plate at its input port or its output port when a defective connection is there made since the liquid passes through the cold plate under high pressure.

In another liquid cooling system, which is used in Cray-2 supercomputers, multichip circuit modules are completely immersed in a liquid bath. But this makes it cumbersome to remove a module for repair. Also, only inert liquids can be used; otherwise conductive traces which interconnect the circuit chips will corrode. Further, the liquid must have a very low dielectric constant so that electrical signals on the conductive traces do not propagate slowly. To meet these requirements, Cray-2 uses a special liquid called FC-77. But its surface tension is four times smaller than the surface tension of water; and this places considerable demands on the seals and gaskets in the cooling system—otherwise they will leak.

Accordingly, a primary object of the invention is to provide an improved liquid cooling module for integrated circuit packages in which all of the above problems, and others, are overcome.

BRIEF SUMMARY OF THE INVENTION

In accordance with the present invention, a liquid cooled circuit module comprises an integrated circuit package; a cover having a rim which lies against the integrated circuit package, the cover being shaped to form a passage for the liquid between the integrated circuit packages and the cover; a retaining mechanism, which is fastened directly to the integrated circuit package, and which includes a member that extends above the cover; and a spring, which is held in compression between the cover and the retaining mechanism member; the spring being adapted to press the rim against the integrated circuit package with at least a predetermined minimal force which prevents leaks and at the same time not exceed a stress limit in the spring.

In one embodiment of the module, the retaining mechanism includes headed pins which are fixedly attached to the integrated circuit package; the retaining mechanism member has tapered openings which are aligned with the pins and in which the headed pins removably lock; and the spring is adapted to maintain at least the predetermined minimal force on the rim and simultaneously not exceed the stress limit even under the condition where the spring is compressed by a variable distance due to several manufacturing tolerances within the module.

BRIEF DESCRIPTION OF THE DRAWINGS

Various features and advantages of the invention are described in detail in the Detailed Description in conjunction with the following drawings wherein:

FIG. 4 is a set of equations which show how the FIG. 1 system operates at subatmospheric pressures when a pump in the system is running;

FIG. 5 is a set of equations which show how the FIG. 1 system operates at subatmospheric pressures when a pump in the system is off;

FIG. 8 is a set of equations which describe how a spring within the cooling module of FIGS. 6 and 7 operates; and FIG. 9 is a sectional view of another embodiment of a cooling module which is suitable for use within the FIG. 1 cooling system.

DETAILED DESCRIPTION OF THE INVENTION

Figure 1:
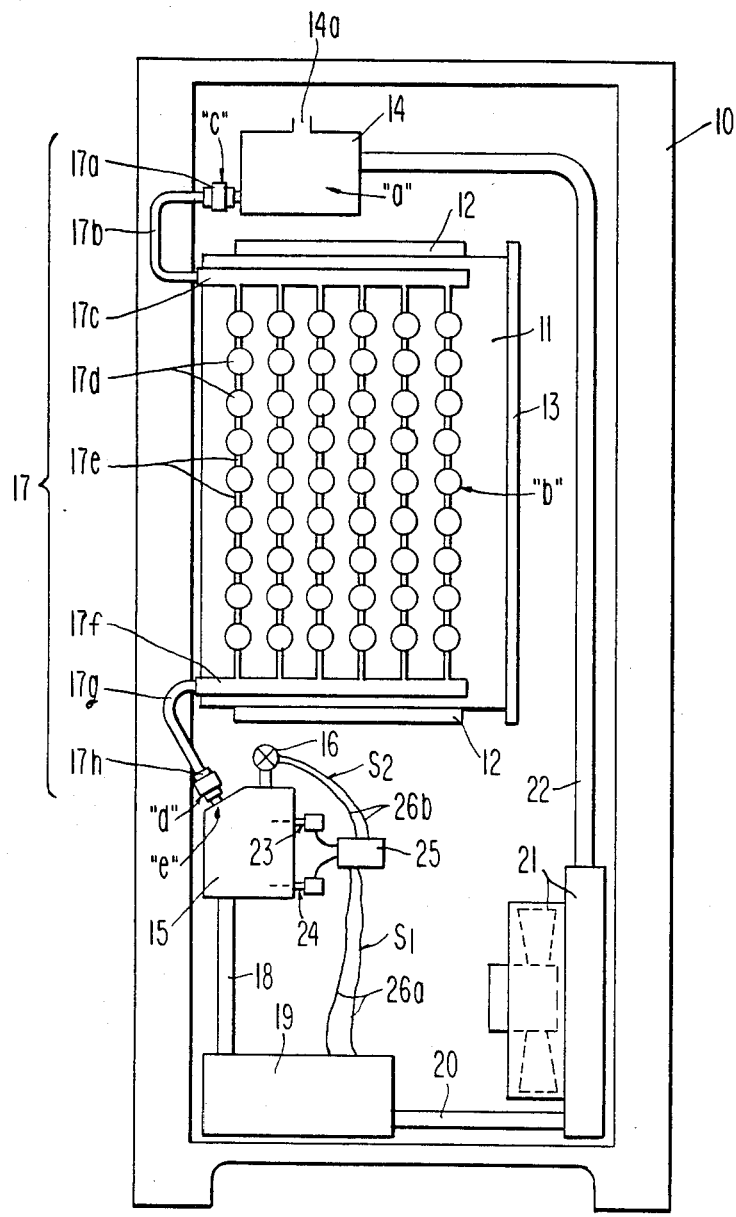
FIG. 1 illustrates a leak tolerant liquid cooling system for electrical components which is constructed in accordance with the invention.

A preferred embodiment of the invention will now be described in conjunction with FIG. 1. That embodiment includes a frame 10 in which a plurality of printed circuit boards 11 are mounted. Only one of the boards 11 is shown in FIG. 1, but the remaining boards are disposed in a parallel fashion behind the illustrated board. These boards are held in place by card guides 12 and they plug into a backplane 13.

Also included in the FIG. 1 embodiment is a top reservoir 14 which is attached to frame 10 above the printed circuit boards. This reservoir 14 has an opening 14a which causes any liquid in the reservoir to be at atmospheric pressure. Lying below the printed circuit boards 11 is a bottom reservoir 15. This reservoir 15 is airtight except that it includes a valve 16 which can be opened to place the bottom reservoir at atmospheric pressure.

A conduit 17 is also included in the FIG. 1 embodiment. It runs from the top reservoir 14, over the printed circuit boards 11, to the bottom reservoir 15. In operation, liquid from the top reservoir 14 passes through the conduit to the bottom reservoir; and in so passing the liquid cools the electrical components on the printed circuit boards.

Several parts 17a thru 17h make up the conduit 17 as indicated in FIG. 1. Items 17a and 17h are valved couplers; items 17b and 17g are flexible tubes; items 17c and 17f are metal or plastic manifolds; items 17d are cooling modules for the electrical components; and items 17e are tubes for interconnecting the cooling modules. A separate conduit 17 is provided for each of the printed circuit boards.

Liquid in the bottom reservoir 15 passes through a pipe 18 to a pump 19. This pump sucks the liquid from the top reservoir through the conduit 17 to the bottom reservoir. Then the pump 19 returns the liquid back to the top reservoir 14 through a pipe 20, a heat exchanger 21, and another pipe 22.

Two level sensors 23 and 24, along with a relay circuit 25, are also included in the FIG. 1 system as shown. They control the operation of the pump 19 as well as the valve 16. Sensor 23 detects when the level of the liquid in the bottom reservoir 15 is at a predetermined high level, whereas sensor 24 detects when that liquid is at a predetermined low level.

Circuit 25 responds to the level sensors 23 and 24 by generating a control signal $S_1$ on conductors 26a which turn the pump 19 on, beginning when the liquid in the bottom reservoir 15 is at the high level, and continuing until the liquid in the bottom reservoir is at the low level. During this time, valve 16 is closed.

Conversely, circuit 25 generates a control signal $S_2$ on conductors 26b which open valve 16 beginning when the liquid in the bottom reservoir 15 is at the low level, and continuing until the liquid in the bottom reservoir reaches the high level. During this time, pump 19 is off.

Figure 2A:
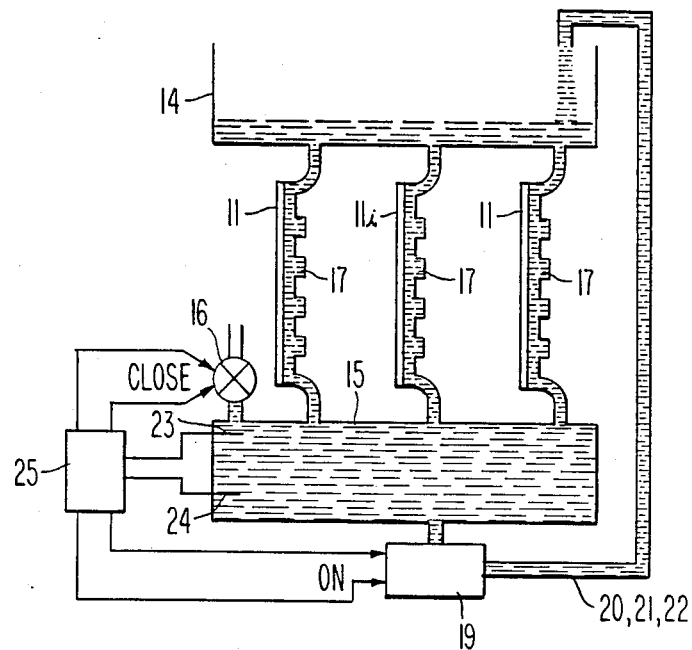
FIGS. 2A–2D illustrate the operation of the FIG. 1 system under the condition where an air leak develops in a conduit within the system.

Reference should now be made to FIGS. 2A–2D which illustrate the operation of the FIG. 1 cooling system under the conditions where a small leak develops in the conduit 17 on one of the boards 11. Initially, as shown in FIG. 2A, there are no leaks, and liquid circulates through the system in a normal fashion. In this state, the liquid is sucked by the pump 19 from the top reservoir 14 through the respective conduits 17 on the printed circuit boards 11 to the bottom reservoir 15; and simultaneously, the liquid is pumped back to the top reservoir.

Figure 2B:
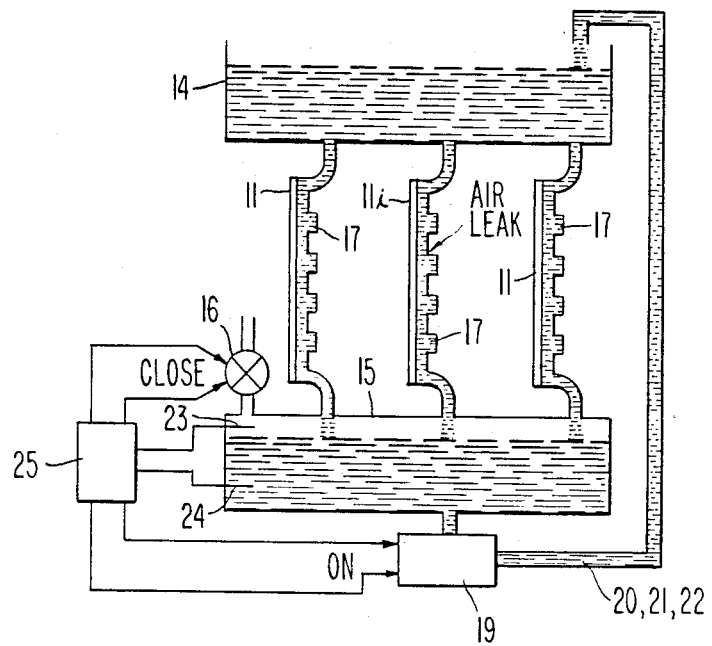

Subsequently, as shown in FIG. 2B, a small leak develops in the conduit on one of the printed circuit boards 11i. This leak may be caused, for example, by a faulty seal in a liquid cooling module 17d; or it could be caused by a faulty connection between a tube 17e and a cooling module.

When such a leak occurs, fluid does not squirt out of the conduit. Instead, air is sucked into the conduit 17 because, as will be explained in conjunction with FIG. 4, the liquid flows through the conduit 17 at subatmospheric pressures. Air which is sucked into conduit 17 passes to the bottom reservoir 15 where it accumulates. Thus, as shown in FIG. 2B, the liquid level in the bottom reservoir 15 drops at a rate which is proportional to the rate at which air is leaked into the conduit.

Figure 2C:
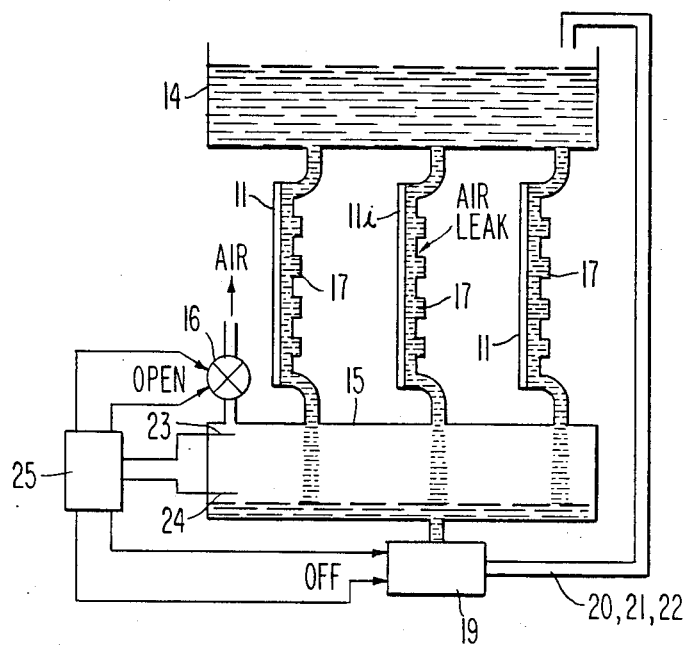

If the leak is small in comparison to the size of the bottom reservoir 15, several hours may pass before the liquid in the bottom reservoir gets to the predetermined low level. During this time, the liquid continues to flow through the conduit 17 and cool the electrical components on the printed circuit boards. Eventually, however, the state of FIG. 2C is reached in which sensor 24 detects that the liquid level in the bottom reservoir 15 is too low.

Figure 2D:
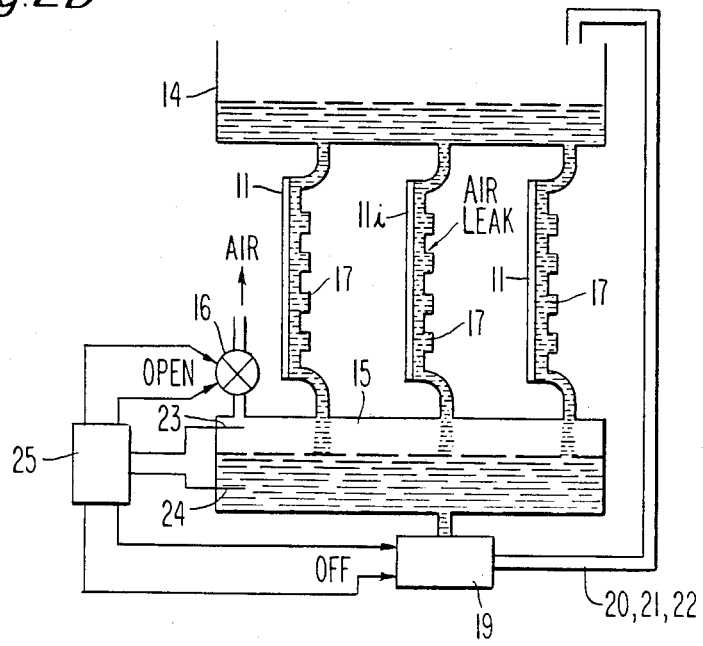

In response, pump 19 is turned off and valve 16 is opened. Consequently, liquid is no longer pumped from the bottom reservoir 15. But liquid does continue to flow from the top reservoir, due to gravity, through the conduit 17 and into the bottom reservoir 15. Thus, as shown in FIG. 2D, the bottom reservoir 15 begins to fill up, and this purges the air from the bottom reservoir through valve 16.

When the liquid in the bottom reservoir 15 reaches the predetermined high level, it is detected by sensor 23. In response, pump 19 turns on and valve 16 closes. This returns the operation of the system back to that which is shown in FIG. 2A. Thus the system will continue to cycle through the operating modes of FIGS. 2A–2D until the air leak in conduit 17 is fixed.

Figure 3A:
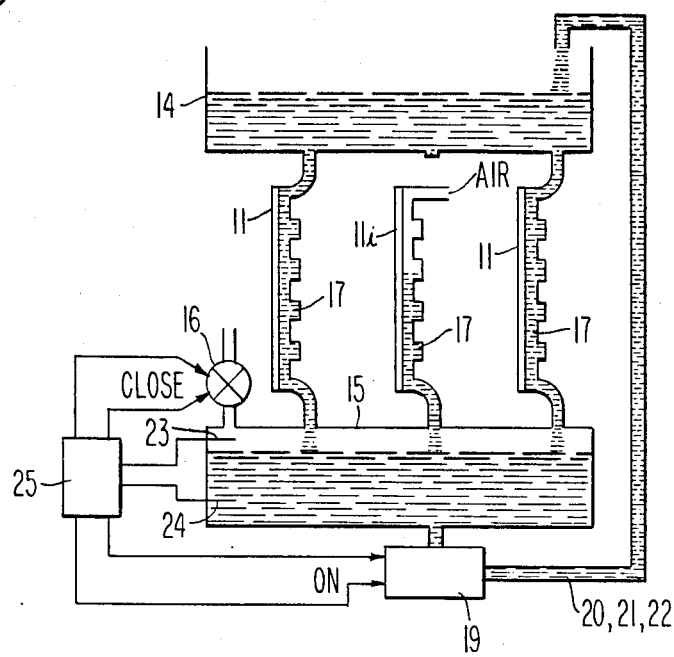
FIGS. 3A–3D illustrate the operation of the FIG. 1 system while a printed circuit board is removed from the system.

Turning next to FIGS. 3A–3D, they show a sequence by which board 11i may be removed from the system without interrupting the cooling system's operation. Initially, as shown in FIG. 3A, board 11i is disconnected from the top reservoir 14. This is achieved via the valved coupler 17a as is shown in FIG. 1. Such a coupler should have a valve on the port which connects to the top reservoir 14 and no valve on the port which connects to the board 11i.

When board 11i is disconnected as shown in FIG. 3A, A large amount of air will be sucked through the conduit 17 on board 11i into the lower reservoir 15. At the same time, any liquid in the conduit on board 11i will drain into the lower reservoir.

Figure 3B:
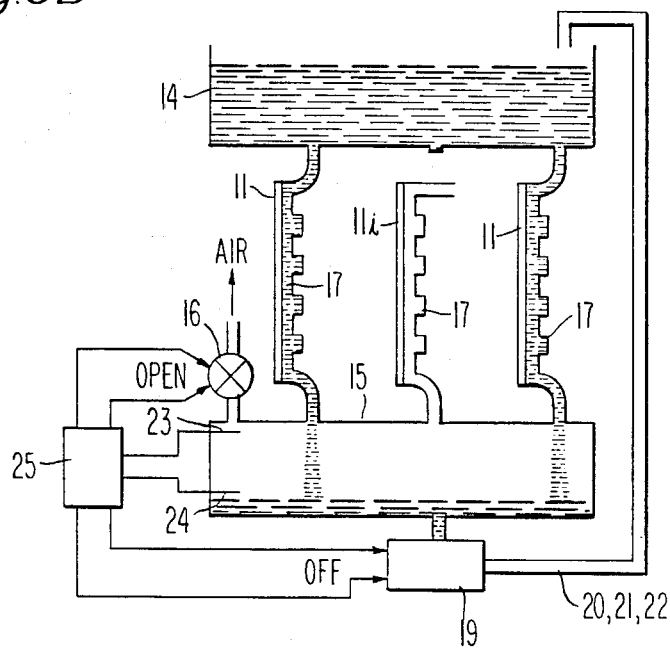
Figure 3C:
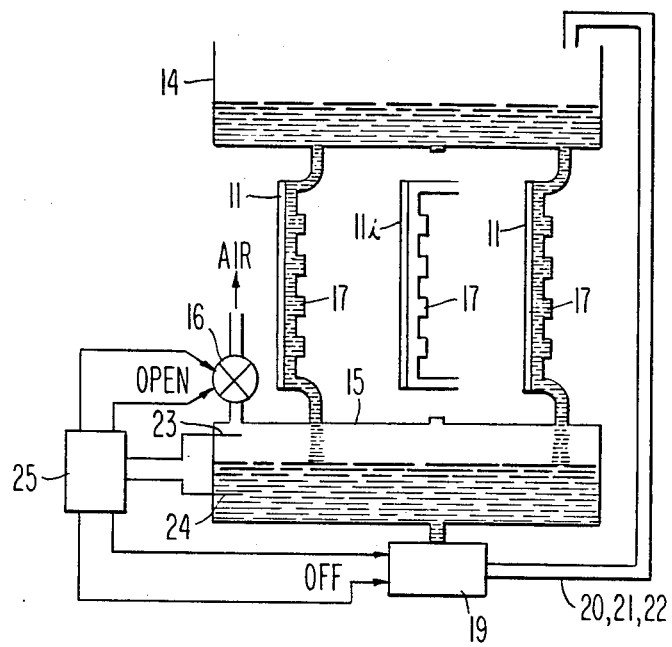

Thus, a state is quickly reached, as shown in FIG. 3B, in which sensor 24 detects that the liquid level in the lower reservoir is too low. Then pump 19 turns off and valve 16 opens. Consequently, as shown in FIG. 3C, the liquid from the top reservoir 14 starts to fill the bottom reservoir 15 due to gravity, and this purges the air from the bottom reservoir.

During the time that the bottom reservoir is being filled, board 11i with its empty conduit 17 can be disconnected from the bottom reservoir 15. This is achieved via the valved coupler 17h as shown in FIG. 1. Such a coupler should have a valve on the port which connects to the bottom reservoir and no valve on the port which connects to the board.

Figure 3D:
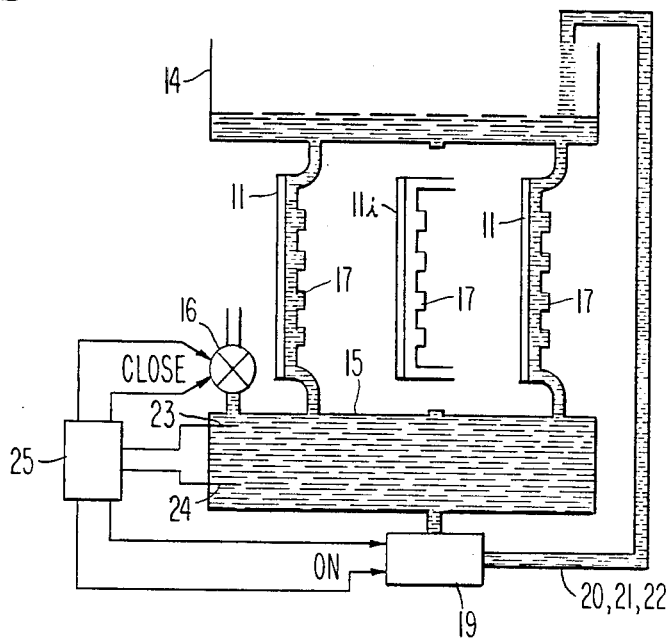

FIG. 3D shows the result of the above disconnecting step. Also, as shown in FIG. 3D, the system will continue to operate in its normal fashion with board 11i removed after the sensor 23 detects that the bottom reservoir is full and turns pump 19 back on.

Consider now FIG. 4 which is a set of equations that shows how the pressure in the fluid of the FIG. 1 system varies as it travels from the top reservoir 14 to the bottom reservoir 15. Equation 1 is Bernouilli's equation as applied to the FIG. 1 system between two points "a" and "b". Point "a" is at the surface of the fluid in the top reservoir and point "b" is at an arbitrary one of the components 17d and 17e on circuit board 11. In equation 1, P is fluid pressure, $\rho$ is fluid density, V is fluid velocity, g is gravity, h is height, and L is pressure losses.

Equation 1 can be simplified if the top reservoir 14 is made large relative to the flow rate of fluid from that reservoir. This reduces the velocity of the fluid in the top reservoir to essentially zero as stated by equation 2. Substituting equation 2 into equation 1 and solving the result for the pressure $P_b$ yields equation 3.

In equation 3, the term $P_a$ is atmospheric pressure since the top reservoir 14 is open to the atmosphere. Thus, in order for the pressure at point "b" to be subatmospheric, the sum of the two rightmost terms in equation 3 must be larger than the third term from the right. This is stated by equation 4.

All of the remaining equations 5 thru 15 give an example of how the constraint of equation 4 can be met. Initially, one should pick the flow rate Q of the fluid through each of the cooling modules 17d such that the electrical components are properly cooled. For example, as stated in equation 5, one suitable Q is 25 milliliters per second.

From the quantity Q, the total flow rate $Q_T$ through valve 17a can be calculated simply by multiplying Q by the number of parallel output ports from the manifold 17c. For example, if there are eight output ports, then the total flow rate $Q_T$ through valve 17a is 200 milliliters per second, as stated by equation 6. This flow rate $Q_T$ is achieved by properly selecting the pump 19.

Given $Q_T$, the pressure drop across valve 17a can be calculated based on empirical data for the particular valve that is being employed. For example, when the flow rate is 200 milliliters per second, a series H single shutoff valve having a one-half inch diameter from Snap-Tight, Inc. produces a pressure drop of 0.65 psi. This is stated by equation 7.

After the fluid passes through the valve 17a, it flows in a downward direction to manifold 17c. Due to this drop in height, a pressure increase will occur. However, if the drop in height is suitably limited, then this pressure increase will not exceed the pressure drop in valve 17a. For example, if the drop in height is six inches, then this pressure increase will only be approximately 0.2 psi as stated by equation 8.

Each time the fluid passes through one of the cooling modules 17d, additional pressure drops occur. Part of this pressure drop is caused by the rapid expansion which the fluid undergoes when it enters the cooling module. This pressure drop can be expressed as an expansion head loss $H_E$ as is stated by equation 9. In that equation, the term $k_e$ is a constant which depends upon the ratio of the diameters of components 17d and 17e. For the diameters as stated by equation 10, $k_e$ is equal to 0.42. Substituting that value of $k_e$ into equation 9 yields equation 11 which says the head loss $H_E$ for the rapid expansion portion of component 17d is 4.05 inches.

Another pressure drop is also incurred each time the fluid leaves a cooling module 17d due to the rapid contraction which occurs. This pressure drop can be expressed as a contraction head loss $H_C$ as is stated by equation 12. In that equation, $k_c$ is a constant which also depends upon the diameter of the components 17d and 17e. For the diameter values given by equation 13, $k_c$ equals 0.32. Substituting a $k_c$ of 0.32 into equation 12 yields equation 14 which says the contraction head loss $H_C$ is 3.07 inches.

Thus the total head loss for one cooling module 17d is 4.05 inches plus 3.07 inches or 7.14 inches. This is stated by equation 15. So long as successive cooling modules 17d are placed less than 7.14 inches apart, the pressure losses through those modules will be greater than the pressure increase which is caused by the fluid's drop in height as it passes from the top of the printed circuit board to the bottom.

Next, reference should be made to FIG. 5 which is a set of equations that describe the operation of the FIG. 1 system under the condition where pump 19 is turned off and valve 16 is open. This condition occurs when fluid in the top reservoir 14 flows to the bottom reservoir 15 under the force of gravity to purge air from the bottom reservoir.

Under this operating condition, it is again desirable to have the fluid pressure in the cooling modules 17b to be subatmospheric so that the fluid does not squirt out of the conduit 17. Thus, the previously described constraint of equation 4 in FIG. 4 must again be met; and it is rewritten as equation 1 in FIG. 5. Equation 1 contains a loss term $L_{ab}$ which can be expressed as equation 2 wherein $K_c$ is a constant for valve 17a; $V_c$ is the velocity of the fluid as it enters valve 17a; n is the number of cooling modules 17d to point "b"; $K_b$ is a constant for one cooling module 17d; and $V_b$ is the fluid velocity as it enters through cooling module 17d.

Based on the number of output ports from manifold 17c and the relative diameters of components 17b and 17c, the fluid velocities $V_b$ and $V_c$ are related as stated by equation 3. Substituting equations 2 and 3 into equation 1 yields equation 4. There the velocity $V_c$ is an unknown since pump 19 is off. However, the velocity $V_c$ can be eliminated from equation 4 by applying Bernoulli's equation between points "a" and "e" in the FIG. 1 system, solving it for $V_c$, and substituting the result into equation 4.

Equation 5 is Bernoulli's equation between points "a" and "e". In it, pressures $P_a$ and $P_e$ are both atmospheric since valve 16 is open; and velocity $V_a$ is again zero. This is stated by equation 6. Substituting equation 6 into equation 5 yields equation 7.

Included in equation 7 is a loss term $L_{ae}$. It equals all of the losses which the fluid undergoes as it travels from point "a" to point "e". Those losses can be expressed as equation 8 wherein N is the total number of cooling modules 17d in one column on printed circuit board 11; $K_d$ is a constant for valve 17h; and $V_d$ is the fluid velocity as it enters valve 17h.

Based on the number of input ports to manifold 17f and on the relative diameters of components 17d, 17e and 17g, the velocities at points "c", "d" and "e" are related as stated by equation 9. Substituting equations 8 and 9 into equation 7 yields equation 10. That equation can be solved for velocity $V_c$; the result can then be substituted into equation 4; and this yields equation 11.

Equation 11 states a constraint on the system parameters which, if met, will cause the fluid pressure in the modules 17d to be subatmospheric when pump 19 is not running. One way in which equation 11 can be met, as an example, is as follows.

Let $\rho=998$ kg/m$^3$ (water), $K_c=1798$ kg/m$^3$, $K_d=K_c$, $K_b=396$ kg/m$^3$, $C_b=1.929$, $C_e=1$, $C_d=1$, $h_a=0$, $h_e=-30''$, $h_a-h_b=6''+2n''$, N=9, and n is an integer from 1 to 9. Substituting these values into equation 11 yields Table 1 below wherein $X_L$ is the value of the lefthand side of equation 11 in FIG. 5 and $X_R$ is the value of the righthand side of equation 11.

TABLE 1

| n | $X_L$ | $X_R$ | $X_L - X_R$ | $X_L/X_R$ |
|---|-------|-------|-------------|-----------|
| 1 | 2,686 | 2,230 | 456 | 1.204 |
| 2 | 3,269 | 2,788 | 481 | 1.173 |
| 3 | 3,851 | 3,345 | 506 | 1.151 |
| 4 | 4,434 | 3,903 | 531 | 1.136 |
| 5 | 5,016 | 4,460 | 556 | 1.125 |
| 6 | 5,599 | 5,018 | 581 | 1.116 |
| 7 | 6,181 | 5,575 | 606 | 1.109 |
| 8 | 6,764 | 6,133 | 631 | 1.103 |
| 9 | 7,346 | 6,690 | 656 | 1.098 |

Figure 6:
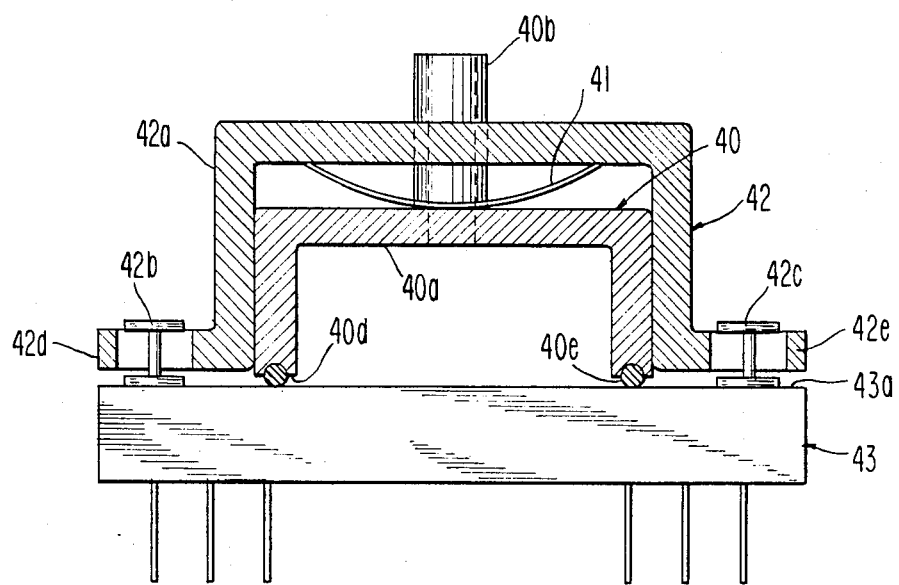
FIG. 6 is a sectional view of an embodiment of a cooling module within the FIG. 1 system.
Figure 7:
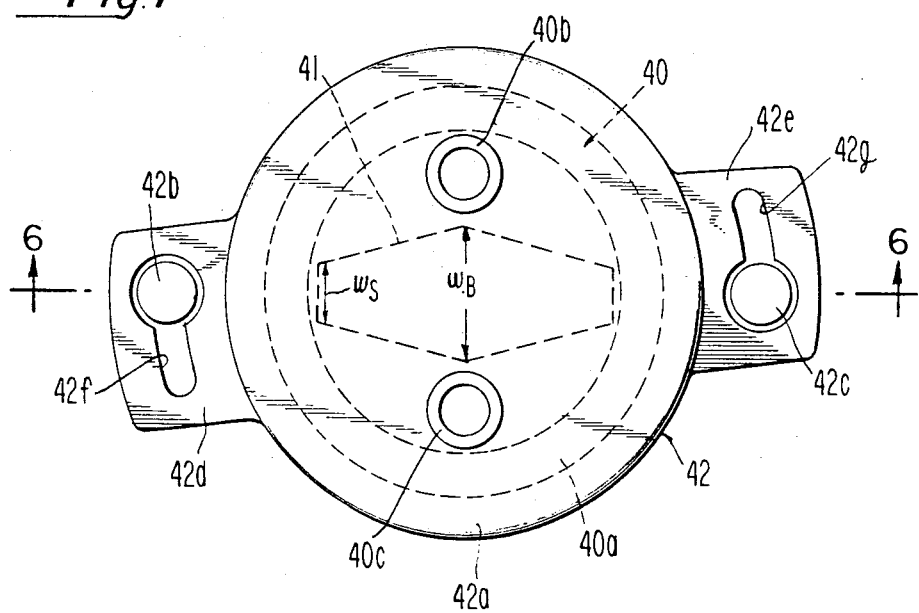
FIG. 7 is a top view of the cooling module of FIG. 6.

Turning now to FIGS. 6 and 7, the details of one preferred embodiment for cooling module 17$d$ will be described. This module includes a cover 40, a spring 41, and a retainer 42. Components 40, 41, and 42 are intercoupled as shown and are attached to a ceramic integrated circuit package 43 which encapsulates one or more integrated circuit chips. Details of package 43 are shown, for example, in U.S. Pat. Nos. 4,576,322 and 4,611,238.

Cover 40 includes a concave-shaped member 40$a$, an input port 40$b$, and an output port 40$c$. Member 40$a$ has a rim 40$d$ with a notch that is fitted with an elastic seal ring 40$e$. That seal ring is compressed against a flat surface 43$a$ of the integrated circuit package. Thus a passage is formed between surface 43$a$ and the concave-shaped member 40$a$ through which fluid can flow to cool the integrated circuit package.

Spring 41 is an arc-shaped leaf spring. Also spring 41 is wide at its center and narrow at its ends. This is desirable because, as will be shown in detail in conjunction with FIG. 8, it allows the spring to maintain a certain minimal force on the cover 40 and simultaneously not overstress the spring even though various dimensions of the cooling module fluctuate from one module to another.

Retainer 42 includes a concave-shaped member 42$a$ and a pair of headed pins 42$b$ and 42$c$. Member 42$a$ lies over the cover member 40$a$, and the pair of headed pins 42$b$ and 42$c$ are rigidly attached such as by brazing to a metal pad on the flat surface 43$a$ of the integrated circuit package. Also, retainer member 42$a$ has a pair of flanges 42$d$ and 42$e$ with respective tapered openings 42$f$ and 42$g$ which are aligned with the headed pins 42$b$ and 42$c$.

When the headed pins are in alignment with the wide portion of the tapered openings, retainer member 42$a$ can be pushed downward on spring 41 such that the headed pins 42$b$ and 42$c$ pass through the openings 42$e$ and 42$f$. This distorts and compresses spring 41. Then, member 42 can be rotated clockwise by a few degrees such that the heads of the pins 42$b$ and 42$c$ overlie the narrow portion of the tapered openings 42$c$ and 42$d$. In that position, the heads of the pins cannot pass through the openings. Thus the retainer member 42 is locked in place such that spring 41 compresses the seal ring 40$d$ with a predetermined stress.

Consider now FIG. 8 which is a set of equations that describe the operation of spring 41. Equation 1 is obtained by summing the forces which act on the cover 40. In equation 1, $F_{SP}$ is the force which the spring exerts on the cover 40; P is the gauge pressure of the fluid as it flows through the cover 40 (the difference between the absolute fluid pressure and atmospheric pressure); A is the surface area of the cover 40 on which the pressure P acts in a vertical direction; and $F_{SR}$ is the force with which the seal ring 40$e$ is compressed against surface 43$a$.

Pressure P is determined by the analysis which was previously described in conjunction with FIG. 4. Area A is determined by the size of the concave-shaped member 40$a$. And a minimum value for force $F_{SR}$ is selected such that the seal ring 40$e$ will not leak.

Force $F_{SP}$ can also be expressed in terms of a spring constant k times the deflection D of the ends of the spring 41. This is stated by equation 2. Substituting equation 2 into equation 1 yields equation 3.

In equation 3, the deflection D varies between a minimum value $D_{min}$ and a maximum value $D_{max}$. Those values depend upon various manufacturing tolerances for the components 40$a$, 42$a$, 42$b$ and 42$c$. For example, the deflection D is smaller than nominal if components 42$a$, 42$b$ and 42$c$ are taller than nominal and component 40$a$ is shorter than nominal.

When the minimal deflection $D_{min}$ occurs, the force which spring 41 exerts must still be greater than the fluid force PA plus the minimum force $F_{SRmin}$ that needs to be maintained on the seal ring 40$e$ in order to prevent leaks. This, as stated by equation 4, is one constraint which must be met by spring 41.

In equation 4, the spring constant term k can be expressed in terms of the physical parameters of the spring 41. This is done via equation 5. There, L is the length of the spring; $w_s$ is the width of the ends of the spring; $w_b$ is the width of the center of the spring; h is the thickness of the spring, and E is the modulus of elasticity of the material from which the spring is made.

Another constraint which must be met by spring 41 concerns the maximum stress S that occurs in the spring. This stress S occurs at the center of the spring. Equation 6 gives an expression for the stress S in terms of the force $F_{SP}$ which the spring exerts and its physical parameters L, $w_s$, and h. Again, the force $F_{SP}$ which the spring exerts is equal to the spring constant k times the distance D by which the ends of the spring are deflected. This was stated above in equation 2. Substituting equation 2 into equation 6 yields equation 7.

In equation 7, the deflection D will have a maximum value $D_{max}$ when components 42$a$, 42$b$ and 42$c$ are manufactured relatively short and component 40$a$ is relatively tall. When that occurs, the stress S must still be less than a value $S_{max}$ at which the spring will permanently deform. This, as stated by equation 8, is a second constraint which must be met by spring 41.

As has been explained above, the pressure P of the fluid under normal operating conditions will be subatmospheric. Thus, under normal operating conditions, the term PA in equation 1 is negative; and this makes the constraints of equations 4 and 8 easier to meet than if the term PA was positive. So, for the purpose of demonstrating how the spring 41 operates under "worst case" conditions, assume now that the pressure P is above atmospheric.

For example, suppose PA is 13.5 pounds; $F_{SRmin}$ is 1.5 pounds; $S_{max}$ is 180 KPSI; $D_{max}$ is D nominal plus 0.015 inches; $D_{min}$ is D nominal minus 0.015 inches; and D nominal is 0.190 inches. Under such conditions, the constraints of equations 44 and 48 can be met by making $w_b=1.5$ inches, $w_s=0.25$ inches; $h=0.015$ inches; $L=1.50$ inches; and $E=20.33 \times 10\exp6$ which is E for BeCu. These values cause the minimum spring force to be 16 pounds (which is greater than $13+5+1.5$), and they cause the maximum spring stress to be 120 KPSI (which is less than 180 KPSI).

Next, referring to FIG. 9, still another preferred embodiment of the cooling module 17d will be described in detail. This module includes a cover 50, a spring 51, and a retainer 52 which are intercoupled to each other and attach to an integrated circuit package 53 as shown.

Cover 50 is similar in shape to the previously described cover 40. It includes a concave-shaped member 50a, an input port 50b, and an output port (not shown,) but which is in alignment with the input port 50b and in front of the spring 51). Cover 50 also has a rim 50d with a notch that is fitted with an elastic seal ring 50e. A passage through which the fluid flows is formed by the concave member 50a, the seal ring 50e, and the surface 53a of the integrated circuit package.

By comparison, the retainer 52 has a totally different shape than the previously described retainer 42. Instead of being concave-shaped, it is uniform in width in a direction perpendicular to the plane of FIG. 9. Thus retainer 52 consists of one uniform width member 52a which lies above cover 50 and two hook-shaped legs 52b and 52c which extend from member 52a and clamp onto the bottom of the integrated circuit package 53. When the legs 52b and 52c are clamped to package 53, member 52a deflects spring 51 which in turn exerts a force of predetermined magnitude on cover 50 such that the seal ring 50e does not leak.

Various preferred embodiments of the invention have now been described in detail. In addition, however, many changes can be made to these details without departing from the nature and spirit of the invention. For example, in the opening 14a of reservoir 14 in FIG. 1, a compliant membrane could be added to prevent contaminants from reaching the fluid and to prevent the fluid from evaporating.

Accordingly, the invention is not to be limited to the described detailed embodiments but is defined by the appended claims.

What is claimed is:

1. A liquid cooled circuit module, comprising:
   an integrated circuit package;
   a cover having a rim which lies against said integrated circuit package, said cover being shaped to form a passage for said liquid between said integrated circuit package and said cover;
   a retaining means, which is fastened to said integrated circuit package, and which includes a member that extends above said cover; and
   a spring, which is held in compression between said cover and said retaining means member; said spring being adapted to press said rim against said integrated circuit package with at least a predetermined minimal force that prevents leaks and at the same time not exceed a stress limit in said spring.

2. A module according to claim 1 wherein said retaining means includes headed pins which are fixedly attached to said integrated circuit package, and wherein said retaining means member has tapered openings which align with said pins and in which said headed pins removably lock.

3. A module according to claim 1 wherein said retaining means member has hook-shaped legs which clamp onto said integrated circuit package.

4. A module according to claim 1 wherein said spring is adapted to maintain at least said minimal force on said rim and simultaneously not exceed said stress limit, under the condition where the amount by which said spring is compressed varies due to manufacturing tolerances within said cover and said retaining means.

5. A module according to claim 1 wherein said spring is a leaf spring having a wide center and narrow ends.

6. A module according to claim 1 wherein said rim is fitted with an elastic seal ring.

7. A module for cooling an electrical component with a liquid, comprising:
   a cover having a rim which is shaped to lie against said electrical component and in such position form a passage for said liquid between said electrical component and said cover;
   a retaining means, which fastens to said electrical component, and which includes a member that extends above said cover; and
   a compliant means, which is held in a distorted fashion between said cover and said retaining means member to press said rim against said electrical component with at least a predetermined minimal force that prevents leaks.

8. A module according to claim 7 wherein said retaining means includes headed pins which fixedly attach to said electrical component, and wherein said retaining means member has tapered openings which align with said pins and in which said headed pins removably lock.

9. A module according to claim 7 wherein said retaining means member has hook-shaped legs which clamp onto said electrical component.

10. A module for cooling an electrical component with a liquid, comprising:
    a cover having a rim which is shaped to lie against said electrical component and in such position form a passage for said liquid between said electrical component and said cover;
    a retaining means, which fastens directly to said electrical component; and
    a compliant means, which is connected between said cover and said retaining means and is adapted to change in shape to hold said rim against said electrical component with at least a predetermined minimal force that prevents leaks.

* * * * *